(12) United States Patent
Wang et al.

(10) Patent No.: US 10,498,298 B1
(45) Date of Patent: Dec. 3, 2019

(54) TIME-DIVISION DUPLEXING USING DYNAMIC TRANSCEIVER ISOLATION

(71) Applicant: Qualcomm Incorporated, San Diego, CA (US)

(72) Inventors: Chuan Wang, San Diego, CA (US); Li Liu, San Diego, CA (US); Bhushan Shanti Asuri, San Diego, CA (US); Kevin Hsi Huai Wang, San Diego, CA (US); Yunfei Feng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/101,200

(22) Filed: Aug. 10, 2018

(51) Int. Cl.
| | |
|---|---|
| *H04L 5/14* | (2006.01) |
| *H04L 27/36* | (2006.01) |
| *H04L 27/38* | (2006.01) |
| *H03F 3/24* | (2006.01) |
| *H03F 1/56* | (2006.01) |
| *H03F 1/02* | (2006.01) |
| *H03F 3/21* | (2006.01) |
| *H03F 3/191* | (2006.01) |

(52) U.S. Cl.
CPC ........... *H03F 3/245* (2013.01); *H03F 1/0277* (2013.01); *H03F 1/565* (2013.01); *H03F 3/191* (2013.01); *H03F 3/211* (2013.01)

(58) Field of Classification Search
CPC ........ H03F 3/245; H03F 1/0277; H03F 1/565; H03F 3/191; H03F 3/211
USPC ...... 375/219, 295, 297, 259; 455/73, 78, 83, 455/91, 130
See application file for complete search history.

(56) References Cited

U.S. PATENT DOCUMENTS

| | | |
|---|---|---|
| 5,541,554 A | 7/1996 | Stengel et al. |
| 6,108,313 A * | 8/2000 | Lee .................. H04B 1/005 333/1.1 |
| 7,170,353 B2 | 1/2007 | Amano |
| 2005/0255810 A1* | 11/2005 | Monroe ............... H01P 1/15 455/78 |

(Continued)

OTHER PUBLICATIONS

Lehmann T., et al., "Reconfigurable Wilkinson Power Dividers with Minimum Numbers of Switches," Electronics Letters, Jan. 15, 2009, vol. 45 No. 2, 2 Pages.

(Continued)

*Primary Examiner* — Tesfaldet Bocure
(74) *Attorney, Agent, or Firm* — Colby Nipper/Qualcomm

(57) ABSTRACT

An apparatus is disclosed for time-division duplex dynamic transceiver isolation. In an example aspect, the apparatus includes an antenna, a power amplifier circuit including at least one power-amplifying path, a low-noise amplifier, and a time-division duplex interface circuit. The interface includes at least one transmit node coupled to the at least one power-amplifying path, a receive node coupled to the low-noise amplifier, and an antenna node. The antenna node is coupled to the at least one transmit node, the receive node, and the antenna. The interface circuit is configured to connect the at least one transmit node, the receive node, and the antenna node together at both a first time and a second time. The interface circuit is configured to isolate the receive node from the antenna node at the first time and isolate the at least one transmit node from the antenna node at the second time.

30 Claims, 8 Drawing Sheets

(56) References Cited

U.S. PATENT DOCUMENTS

2006/0291407 A1* 12/2006 Johnson ............... H04L 5/1469
370/294
2016/0191105 A1  6/2016 King et al.

OTHER PUBLICATIONS

Wang H., et al., "MM-Wave Integration and Combinations", IEEE Microwave Magazine, Jul./Aug. 2012, pp. 49-57.

* cited by examiner

TIME-DIVISION DUPLEXING USING DYNAMIC TRANSCEIVER ISOLATION

TECHNICAL FIELD

This disclosure relates generally to wireless transceivers and, more specifically, to dynamically providing transceiver isolation between a power amplifier circuit, a low-noise amplifier, and an antenna for time-division duplex operations.

BACKGROUND

Electronic devices use radio-frequency (RF) signals to communicate information. These radio-frequency signals enable users to talk with friends, download information, share pictures, remotely control household devices, receive global positioning information, employ radar for detection and tracking, or listen to radio stations. As these radio-frequency signals travel over larger distances, it becomes increasingly challenging to distinguish the radio-frequency signals from background noise. To address this issue, electronic devices use power amplifiers (PAs) and low-noise amplifiers (LNAs) to amplify radio-frequency signals without introducing significant additional noise.

For time-division duplex operations, transmission and reception are performed at different times. Accordingly, a transmitter can generate an uplink signal for transmission at a first time and a receiver can process a downlink signal at a second time. In some situations, an antenna is used to transmit the uplink signal and receive the downlink signal. However, it may be challenging for some interface approaches to provide sufficient isolation between the transmitter and the receiver. As an example, an interface approach may use a switch to selectively connect the transmitter or the receiver to the antenna. For some semiconductor manufacturing processes, however, it may be difficult to design the switch to provide sufficient isolation. It may also be challenging to design the switch to provide sufficient isolation at higher radio frequencies (e.g., millimeter-wave frequencies). Without sufficient transceiver isolation, a signal-to-noise ratio performance may degrade and increase power consumption of the transmitter or limit long-distance detection capabilities of the receiver.

SUMMARY

An apparatus is disclosed that implements time-division duplexing using dynamic transceiver isolation. The described techniques include a time-division duplex interface circuit that connects a power amplifier circuit of a transmitter, a low-noise amplifier of a receiver, and an antenna together. The time-division duplex interface dynamically isolates the power amplifier or the low-noise amplifier from the antenna based on time-division duplex operations. To provide sufficient transceiver isolation, the time-division duplex interface operates with a high impedance as seen from the antenna to the low-noise amplifier during transmission and with another high impedance from the antenna to the power amplifier during reception. In this way, a significant portion of an uplink signal may pass from the power amplifier to the antenna instead of to the low-noise amplifier during transmission. Likewise a significant portion of a downlink signal may pass from the antenna to the low-noise amplifier instead of to the power amplifier during reception. Without using series switches along transmitter and receiver signals paths, the time-division duplex interface circuit is able to provide dynamic transceiver isolation in both a transmit mode and a receive mode, and for different power modes (e.g., a high-power mode, a mid-power mode, and a low-power mode). Because the time-division duplex interface circuit can support multiple power modes, the transceiver may operate at lower power modes to reduce power consumption and improve power efficiency. The time-division duplex interface circuit can also improves a noise figure of the receiver.

The time-division duplex interface may also support multiple transmit power modes, such as a high-power transmit mode and a low-power transmit mode. If the power amplifier circuit uses multiple power-amplifying paths to provide amplification for the high-power transmit mode, for example, the time-division duplex interface can operate as a power combiner and provide isolation between the multiple power-amplifying paths during transmission. For the low-power transmit mode whereby one of the multiple power-amplifying paths is active and another one of the multiple power-amplifying paths is inactive, the time-division duplex interface can isolate the inactive power-amplifying path from the antenna to pass a significant portion of the uplink signal from the active power-amplifying path to the antenna instead of to the inactive power-amplifying path. In this way, the time-division duplex interface enables the power amplifier circuit to reduce power consumption and realize increased back-off power efficiency.

In an example aspect, an apparatus is disclosed. The apparatus includes an antenna, a power amplifier circuit, a low-noise amplifier, and a time-division duplex interface circuit. The power amplifier circuit includes at least one power-amplifying path. The interface includes at least one transmit node, a receive node, and an antenna node. The at least one transmit node is coupled to the at least one power-amplifying path. The receive node is coupled to the low-noise amplifier. The antenna node is coupled to the at least one transmit node, the receive node, and the antenna. The interface circuit is configured to connect the at least one transmit node, the receive node, and the antenna node together at both a first time and a second time. At the first time, the interface circuit is configured to isolate the receive node from the antenna node. At the second time, the interface circuit is configured to isolate the at least one transmit node from the antenna node.

In an example aspect, an apparatus is disclosed. The apparatus includes an antenna, a power amplifier circuit, and a low-noise amplifier. The power amplifier circuit includes at least one power-amplifying path. The apparatus also includes interface means for isolating the low-noise amplifier from the antenna at a first time and isolating the at least one power-amplifying path from the antenna at a second time while connecting the at least one power-amplifying path, the low-noise amplifier, and the antenna together at both the first time and the second time.

In an example aspect, a method for time-division duplexing using dynamic transceiver isolation is disclosed. The method includes amplifying an uplink signal at a first time using at least one power-amplifying path of a power amplifier circuit, the at least one power-amplifying path connected to an antenna and a low-noise amplifier. The method also includes isolating the low-noise amplifier from the antenna at the first time to pass the uplink signal from the at least one power-amplifying path to the antenna. The method additionally includes transmitting the uplink signal at the first time using the antenna. At a second time, the method includes receiving a downlink signal using the antenna. The method also includes isolating the at least one power-amplifying path from the antenna at the second time to pass the downlink signal from the antenna to the low-noise amplifier. The method additionally includes amplifying the downlink signal at the second time using the low-noise amplifier.

In an example aspect, an apparatus is disclosed. The apparatus includes an antenna, a power amplifier circuit, and a time-division duplex interface circuit. The power amplifier circuit includes two power-amplifying paths. The interface circuit includes two transmit nodes and an antenna node. The two transmit nodes are respectively coupled to the two power-amplifying paths. The antenna node is coupled to the two transmit nodes and the antenna. The interface circuit is configured connect the two transmit nodes and the antenna node together at both a first time and a second time. At the first time, the interface circuit is configured to isolate a transmit node of the two transmit nodes from the antenna node. At the second time, the interface circuit is configured to isolate the two transmit nodes from each other.

BRIEF DESCRIPTION OF DRAWINGS

FIG. 4-1 illustrates an example power-combining and impedance-matching circuit for time-division duplexing using dynamic transceiver isolation.

FIG. 4-2 illustrates example implementations of quarter-wave impedance transformers and a switch-resistor network for time-division duplexing using dynamic transceiver isolation.

DETAILED DESCRIPTION

Figure 1:
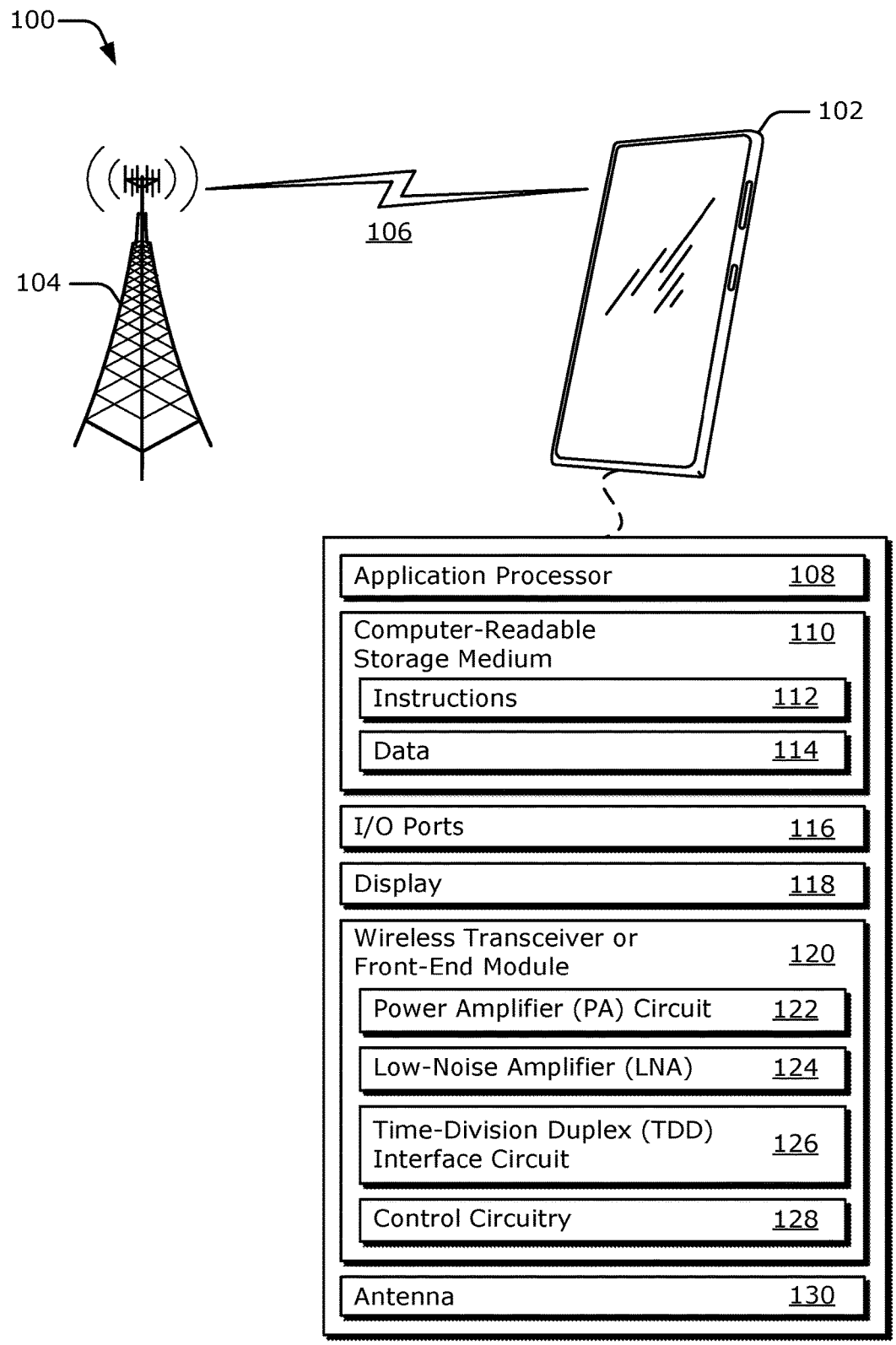
FIG. 1 illustrates an example operating environment for time-division duplexing using dynamic transceiver isolation.

Some wireless transceivers may perform time-division duplex operations using an antenna to transmit and receive communication signals at different times. It may be challenging, however, to provide sufficient isolation between a transmitter and a receiver that are coupled to the antenna. Without sufficient isolation, a portion of an amplified signal generated by the transmitter may propagate to the receiver instead of the antenna during transmission. Likewise, a portion of a received signal may propagate to the transmitter instead of the receiver during reception. Consequently, the wireless transceiver may experience degraded signal-to-noise ratio performance and be unable to support long-distance communications. Insufficient isolation may also increase power consumption within the transceiver during transmission. While some interface approaches may include a switch that alternatingly connects the transmitter or the receiver to the antenna, it may be challenging to design the switch to provide sufficient isolation for high-frequency communication signals, such as those used for fifth-generation (5G) or millimeter-wave communications (e.g., for frequencies at or near the extremely-high frequency (EHF) spectrum or greater than approximately 25 gigahertz (GHz)). It may also be expensive to integrate the switch between the transmitter, the receiver and the antenna.

In contrast to the approaches described above, techniques for time-division duplexing using dynamic transceiver isolation are described herein. The described techniques include a time-division duplex interface circuit that connects a power amplifier circuit of a transmitter, a low-noise amplifier of a receiver, and an antenna together. The time-division duplex interface dynamically isolates the power amplifier or the low-noise amplifier from the antenna based on time-division duplex operations, as well as the power amplifier operation modes, like high power, middle power or low power mode. To provide sufficient isolation, the time-division duplex interface operates with a high impedance as seen from the antenna to the low-noise amplifier during transmission and with another high impedance from the antenna to the power amplifier during reception. In this way, a significant portion of an uplink signal may pass from the power amplifier to the antenna instead of to the low-noise amplifier during transmission. Likewise a significant portion of a downlink signal may pass from the antenna to the low-noise amplifier instead of to the power amplifier during reception. Without using series switches along transmitter and receiver signals paths, the time-division duplex interface circuit is able to provide dynamic transceiver isolation in both a transmit mode and a receive mode, and for different power modes (e.g., a high-power mode, a mid-power mode, and a low-power mode). Because the time-division duplex interface circuit can support multiple power modes, the transceiver may operate at lower power modes to reduce power consumption and improve power efficiency. The time-division duplex interface circuit can also improve a noise figure of the receiver.

The time-division duplex interface may also support multiple transmit power modes, such as a high-power transmit mode and a low-power transmit mode. If the power amplifier circuit uses multiple power-amplifying paths to provide amplification for the high-power transmit mode, for example, the time-division duplex interface can operate as a power combiner and provide isolation between the multiple power-amplifying paths during transmission. For the low-power transmit mode whereby one of the multiple power-amplifying paths is active and another one of the multiple power-amplifying paths is inactive, the time-division duplex interface can isolate the inactive power-amplifying path from the antenna to pass a significant portion of the uplink signal from the active power-amplifying path to the antenna instead of to the inactive power-amplifying path. In this way, the time-division duplex interface enables the power amplifier circuit to reduce power consumption and realize increased back-off power efficiency.

FIG. 1 illustrates an example environment 100 for time-division duplexing using dynamic transceiver isolation. FIG. 1 illustrates an example environment 100 for performing amplification in the presence of a variable antenna impedance. In the example environment 100, a computing device 102 communicates with a base station 104 through a wireless communication link 106 (wireless link 106). In this example, the computing device 102 is implemented as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, vehicle-based communication system, radar, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, or an uplink of other data or control information communicated from the computing device 102 to the base station 104. The wireless link 106 may be implemented using any suitable communication protocol or standard, such as 3rd Generation Partnership Project Long-Term Evolution (3GPP LTE), 5th Generation (5G), IEEE 802.11, IEEE 802.16, Bluetooth™, and so forth. In some implementations, instead of or in addition to providing a data link, the wireless link 106 may wirelessly provide power and the base station 104 may comprise a power source.

The computing device 102 includes an application processor 108 and a computer-readable storage medium 110 (CRM 110). The application processor 108 may include any type of processor, such as a multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver or front-end module 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver or front-end module 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver or front-end module 120 enables the computing device 102 to communicate with the base station 104 and networks connected therewith.

The wireless transceiver or front-end module 120 includes circuitry and logic for transmitting and receiving communication signals via at least one antenna 130. Components of the wireless transceiver or front-end module 120 can include amplifiers, switches, mixers, analog-to-digital converters, filters, and so forth for conditioning the communication signals. The wireless transceiver or front-end module 120 may also include logic to perform in-phase/quadrature (I/Q) operations, such as synthesis, encoding, modulation, decoding, demodulation, and so forth. In some cases, components of the wireless transceiver or front-end module 120 are implemented as separate receiver and transmitter entities. Additionally or alternatively, the wireless transceiver or front-end module 120 can be realized using multiple or different sections to implement respective receiving and transmitting operations (e.g., separate transmit and receiver chains). In general, the wireless transceiver or front-end module 120 processes data and/or signals associated with communicating data of the computing device 102 over the antenna 130.

The wireless transceiver or front-end module 120 includes at least one power amplifier circuit 122, at least one low-noise amplifier 124, at least one time-division duplex (TDD) interface circuit 126, and control circuitry 128. The time-division duplex interface circuit 126 couples the power amplifier circuit 122, the low-noise amplifier 124, and the antenna 130 together. The power amplifier circuit 122 includes at least one power-amplifying path, which amplifies at least a portion of a radio-frequency signal (e.g., an uplink signal) for transmission via the antenna 130. The power amplifier circuit 122 comprises a last amplifier stage within a transmission chain of the wireless transceiver or front-end module 120 (e.g., there is not another amplifier stage between the power amplifier circuit 122 and the antenna 130). The low-noise amplifier 124 amplifies a radio-frequency signal (e.g., a downlink signal) that is received by the antenna 130. The time-division duplex interface circuit 126 alternatively isolates the power amplifier circuit 122 or the low-noise amplifier 124 from the antenna 130 based on whether the antenna 130 is receiving or transmitting, respectively.

The control circuitry 128 can be implemented in software (which is incorporated in or realized using hardware and may be executed by a digital signal processor or a modem), firmware, hardware, fixed logic circuitry (e.g., digital logic gates), or combinations thereof. The control circuitry 128 may also perform other operations, such as providing timing control, performing register reads or writes, or implementing a state machine for performing time-division duplex operations. The wireless transceiver or front-end module 120 is further described with respect to FIG. 2.

Figure 2:
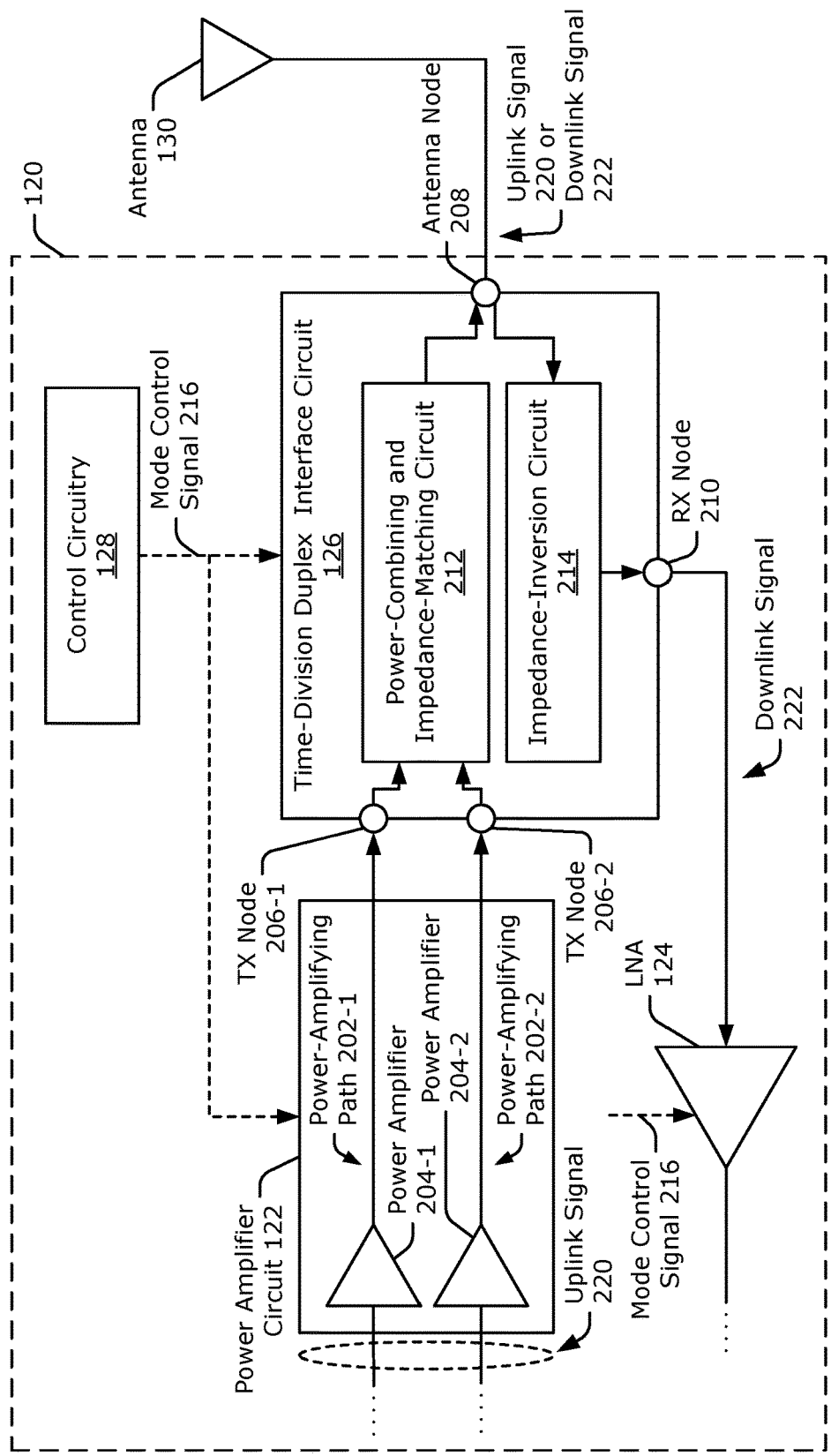
FIG. 2 illustrates a portion of an example wireless transceiver or front-end module for time-division duplexing using dynamic transceiver isolation.

FIG. 2 illustrates a portion of the wireless transceiver or front-end module 120 for time-division duplexing using dynamic transceiver isolation. In the depicted configuration, the power amplifier circuit 122 includes two power-amplifying paths 202-1 and 202-2. The power-amplifying paths 202-1 and 202-2 are generally considered parallel power-amplifying paths and can be independently activated (e.g., enabled) or deactivated (e.g., disabled) to realize a target gain. Each of the power-amplifying paths 202-1 and 202-2 include at least one power amplifier, as shown by power amplifiers 204-1 and 204-2, respectively. An input of the power amplifier circuit 122 may be coupled to other components within the wireless transceiver or front-end module 120, such as a filter or a mixer. Although not shown, the power amplifier circuit 122 can include an input power splitter, which is coupled to the two power-amplifying paths 202-1 and 202-2. The input power splitter can split (e.g., divide) a radio-frequency signal into two portions and respectively provide the portions to the power-amplifying paths 202-1 and 202-2 for amplification. The power-amplifying paths 202-1 and 202-2 are further described with respect to FIG. 3.

The time-division duplex interface circuit 126 includes two transmit (TX) nodes 206-1 and 206-2, an antenna node 208, and a receive (RX) node 210. The transmit nodes 206-1 and 206-2 are respectively coupled to the power-amplifying paths 202-1 and 202-2 of the power amplifier circuit 122. The antenna node 208 is coupled to the antenna 130. The receive node 210 is coupled to the low-noise amplifier 124. Although not shown, the low-noise amplifier 124 may be coupled to other components within the wireless transceiver or front-end module 120, such as a filter or a mixer.

The time-division duplex interface circuit 126 also includes a power-combining and impedance-matching circuit 212 and an impedance-inversion circuit 214. The power-combining and impedance-matching circuit 212 is coupled between the transmit nodes 206-1 and 206-2 and the antenna node 208, and is described in further detail with respect to FIGS. 4-1 and 4-2. The impedance-inversion circuit 214 is coupled between the receive node 210 and the antenna node 208, and is described in further detail with respect to FIG. 5. Through the power-combining and impedance-matching circuit 212 and the impedance-inversion circuit 214, the transmit nodes 206-1 and 206-2, the receive node 210, and the antenna node 208 are connected together. In general, the time-division duplex interface circuit 126 does not include any switches coupled in series between either of the transmit nodes 206-1 or 206-2 and the antenna node 208 or in series between the receive node 210 and the antenna node 208. As such, the power amplifier circuit 122, the low-noise amplifier 124, and the antenna 130 remain connected together during both transmission and reception.

The control circuitry 128 is coupled to the power amplifier circuit 122 and the time-division duplex interface circuit 126. The control circuitry 128 has knowledge of or control over operational modes of the wireless transceiver or front-end module 120. Example operational modes may be associated with time-division duplex operations or different power levels, such as a low-power transmit mode, a high-power transmit mode, or a receive mode. Based on the operational mode, the control circuitry 128 generates a mode control signal 216, which is provided to both the power amplifier circuit 122 and the time-division duplex interface circuit 126. The mode control signal 216 controls operational states of components within the power amplifier circuit 122 and the time-division duplex interface circuit 126, as described in further detail below. The mode control signal 216 may be a multi-bit signal with each bit or group of bits configured to control an operational state of a particular component.

To transmit an uplink signal 220 at a first time, the control circuitry 128 activates at least one of the power-amplifying paths 202-1 or 202-2 via the mode control signal 216. Using the active power-amplifying path 202-1 or 202-2, the power amplifier circuit 122 amplifies the uplink signal 220. Within the time-division duplex interface circuit 126, the mode control signal 216 causes the power-combining and impedance-matching circuit 212 to operate with a low impedance from at least one of the transmit nodes 206-1 and 206-2 to the antenna node 208. The mode control signal 216 also causes the impedance-inversion circuit 214 to operate with a high impedance from the antenna node 208 to the receive node 210 to isolate the low-noise amplifier 124 from the antenna 130. Due to the low impedance and the high impedance, the power-amplifying and impedance-matching circuit 212 passes a significant portion of the uplink signal 220 from the active power-amplifying path 202-1 or 202-2 to the antenna 130.

If one of the power-amplifying paths 202-1 or 202-2 is deactivated by the mode control signal 216, such as for a low-power transmit mode, the control circuitry 128 can cause the power-combining and impedance-matching circuit 212 to operate with a high impedance from the antenna node 208 to one of the transmit nodes 206-1 or 206-2 that is coupled to the inactive power-amplifying path 202-1 or 202-2. Alternatively for a high-power transmit mode, both of the power-amplifying paths 202-1 and 202-2 may be activated by the mode control signal 216. In this case, the power-combining and impedance-matching circuit 212 can provide respective low impedances from the transmit nodes 206-1 and 206-2 to the antenna node 208. The power-combining and impedance-matching circuit 212 can also isolate the transmit nodes 206-1 and 206-2 and combine amplified portions of the uplink signal 220 that are produced by the power-amplifying paths 202-1 and 202-2. The power-combining and impedance-matching circuit 212 provides the combined amplified portions of the uplink signal 220 at the antenna node 208 for transmission via the antenna 130.

At a second time, the antenna 130 receives a downlink signal 222 and provides the downlink signal 222 to the antenna node 208. The control circuitry 128 causes the impedance-inversion circuit 214 to operate with a low impedance from the antenna node 208 to the receive node 210 via the mode control signal 216. The mode control signal 216 also causes the power-combining and impedance-matching circuit 212 to operate with high impedances from the antenna node 208 to both of the transmit nodes 206-1 and 206-2. Due to the low impedance and the high impedances, the impedance-inversion circuit 214 passes a significant portion of the downlink signal 222 from the antenna node 208 to the receive node 210. The low-noise amplifier 124 amplifies the downlink signal 222 and provides the downlink signal 222 to other components within the wireless transceiver or front-end module 120.

By providing low impedances or high impedances for different signal directions at different times, both the power-combining and impedance-matching circuit 212 and the impedance-inversion circuit 214 realize impedance inversion. With these impedance-inversion abilities, the time-division duplex interface circuit 126 can dynamically adjust which nodes are isolated to support multiple transmission power levels and realize a target signal-to-noise ratio performance for both transmission and reception. The power-amplifying paths 202-1 and 202-2 are further described with respect to FIG. 3.

Figure 3:
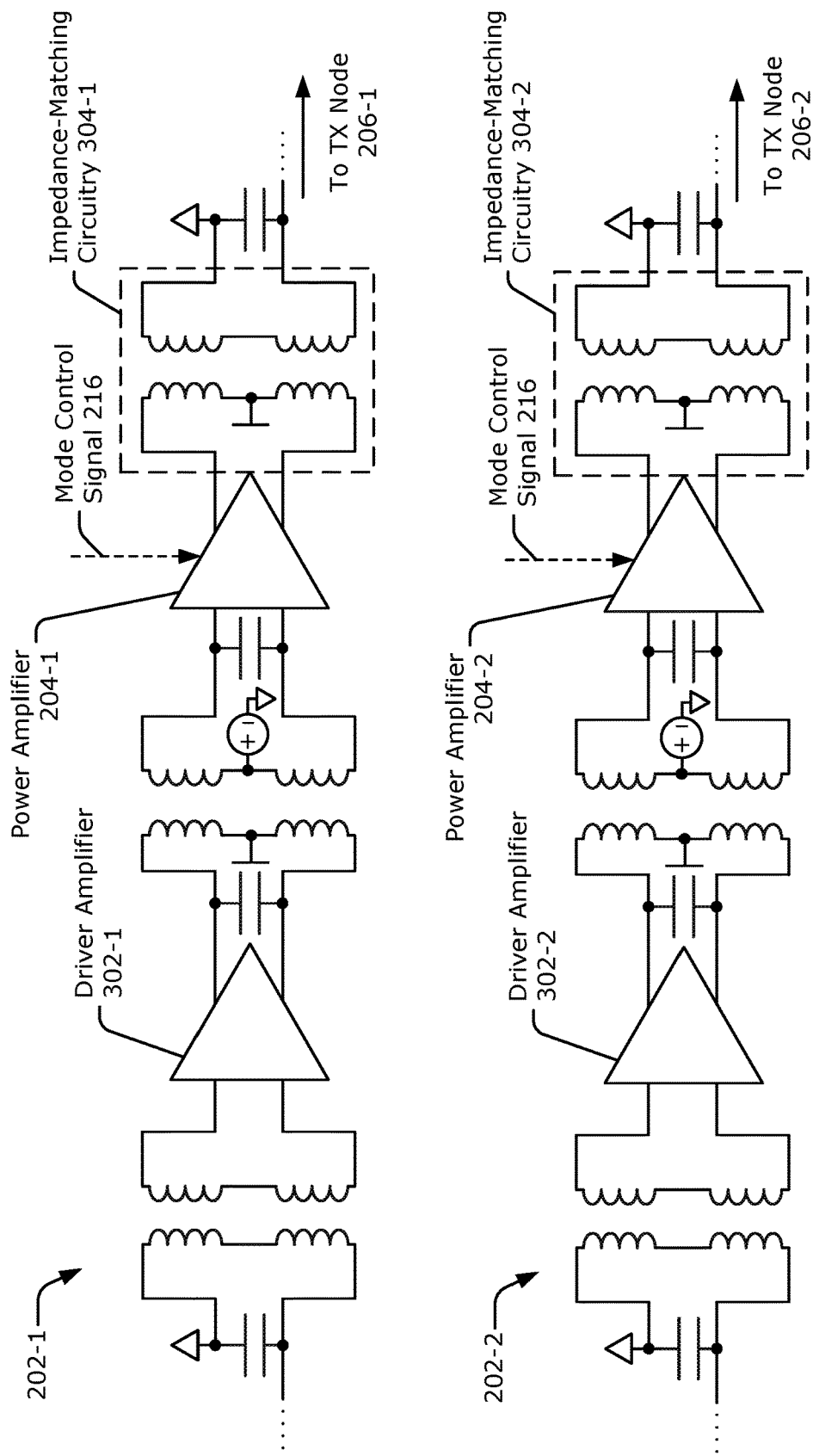
FIG. 3 illustrates example power-amplifying paths for time-division duplexing using dynamic transceiver isolation.

FIG. 3 illustrates example power-amplifying paths 202-1 and 202-2 for time-division duplexing using dynamic transceiver isolation. In the depicted configuration, the two power-amplifying paths 202-1 and 202-2 respectively include two cascaded amplifier stages, though any quantity of amplifying stages may be implemented. The power-amplifying path 202-1 includes a driver amplifier 302-1 within a first amplifying stage and the power amplifier 204-1 (of FIG. 2) within a last amplifying stage. Similarly, the power-amplifying path 202-2 includes another driver amplifier 302-2 and the power amplifier 204-2 (of FIG. 2).

The power amplifiers 204-1 and 204-2 are coupled to the control circuitry 128 (not shown) and accept the mode control signal 216. The mode control signal 216 specifies an operational state of the power amplifiers 204-1 and 204-2, such as an active state (e.g., on-state) or an inactive state (e.g., an off-state). In general, the power-amplifying paths 202-1 and 202-2 are considered to be in an active (e.g., enabled) state if the power amplifiers 204-1 and 204-2 are in the active state. Similarly, the power-amplifying paths 202-1 and 202-2 are considered to be in an inactive (e.g., disabled) state if the power amplifiers 204-1 are 204-2 are in the inactive state. If one of the power-amplifying path 202-1 or 202-2 is inactive, the power amplifier circuit 122 consumes less power relative to if both of the power-amplifying paths 202-1 are 202-2 are active.

In different implementations, the power amplifier circuit 122 may be implemented as a "balanced" power-amplifier circuit or an "unbalanced" power-amplifier circuit. In the "balanced" power-amplifier circuit, the power amplifiers 204-1 and 204-2 may be relatively similar and the power-amplifying paths 202-1 and 202-2 may provide relatively similar amounts of amplification. In the "unbalanced" power-amplifier circuit, the power amplifiers 204-1 and 204-2 may be relatively different and the power-amplifying paths 202-1 and 202-2 may provide relatively different amounts of amplification. With multiple power-amplifying paths 202-1 and 202-2, the power amplifier circuit 122 can support at least two different transmit power modes. The different transmit power modes are realized by activating or deactivating different combinations of the power-amplifying paths 202-1 and 202-2.

For an example high-power transmit mode, both power-amplifying paths 202-1 and 202-2 are in the active state to amplify portions of the uplink signal 220. Because the time-division duplex interface circuit 126 combines the amplified portions at the antenna node 208, a high-power uplink signal is provided at the antenna node 208 for transmission. Alternatively, for an example low-power transmit mode, one of the power-amplifying paths 202-1 or 202-2 is in the active state to amplify the uplink signal 220. To reduce self-generated noise, conserve power, and improve back-off power efficiency, another of the power-amplifying paths 202-1 or 202-2 is in the inactive state. The power-combining and impedance-matching circuit 212 can isolate the inactive power-amplifying path 202-1 or 202-2 from the antenna 130 to improve a signal-to-noise ratio of a low-power uplink signal that is provided at the antenna node 208 for transmission.

In some situations, the power amplifier circuit 122 may be configured for three different transmit power modes (e.g., a high-power transmit mode, a mid-power transmit mode, or a low-power transmit mode) if the power-amplifying paths 202-1 and 202-2 provide different amounts of amplification. For the high-power transmit mode, both power-amplifying paths 202-1 are in the active state, as described above. For the mid-power transmit mode and the low-power transmit mode, one of the power-amplifying paths 202-1 and 202-2 is in the active state while another of the power-amplifying paths 202-1 and 202-2 is in the inactive state. For the mid-power transmit mode, the power-amplifying path 202-1 or 202-2 that provides a larger amount of amplification is active. Alternatively for the low-power transmit mode, the power-amplifying path 202-1 or 202-2 that provides a smaller amount of amplification is active.

In addition to the amplifiers, the power-amplifying paths 202-1 and 202-2 may also include impedance-matching circuitry, as shown by impedance-matching circuitry 304-1 and 304-2, respectively. In this case, the impedance-matching circuitry 304-1 and 304-2 are implemented using trans-formers and can provide at least a portion of a target impedance translation ratio for matching output impedances of the power amplifiers 204-1 and 204-2 to an input impedance of the antenna 130. Depending on the implementation, the impedance-matching circuitry 304-1 and 304-2 may operate with relatively similar or different impedance translation ratios. Because the power-combiner and impedance-matching circuit 212 can also provide another portion of the target impedance transformation ratio, the impedance-matching circuitry 304-1 and 304-2 can be designed to operate with a small impedance transformation ratio rather than a large impedance transformation ratio. Due to the small impedance transformation ratio, load impedances for the power amplifiers 204-1 and 204-2 may decrease, which enables the power-amplifying paths 202-1 and 202-2 to realize higher gains. A size of the impedance-matching circuitry 304-1 and 304-2 may also be reduced because of the small impedance transformation ratio to conserve space within the power amplifier circuit 122. The impedance-matching circuitry 304-1 and 304-2 are coupled to the power-combining and impedance-matching circuit 212 via the transmit nodes 206-1 and 206-2, as shown in FIG. 4-1.

Figures 1, 4:
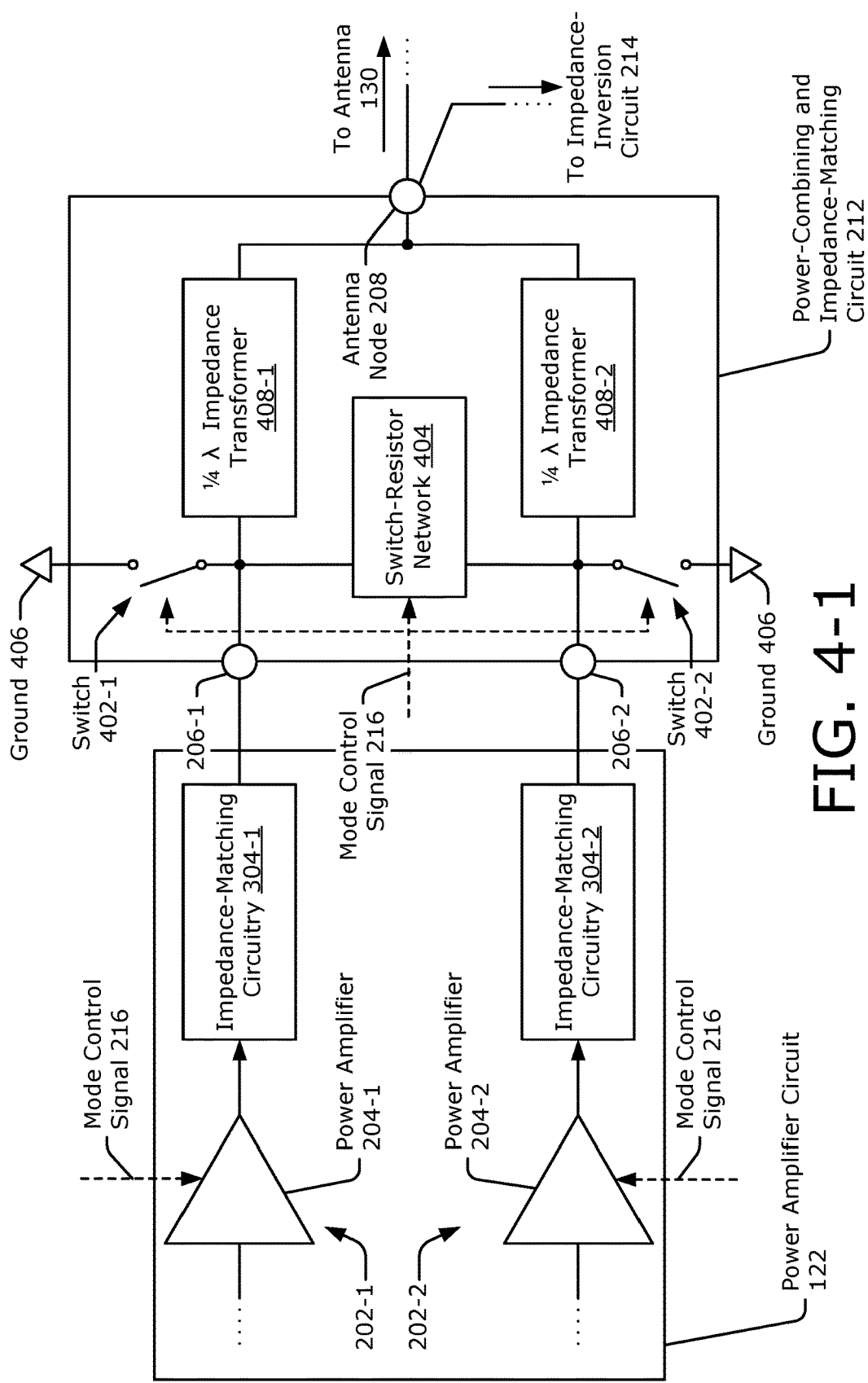
Figures 2, 4:
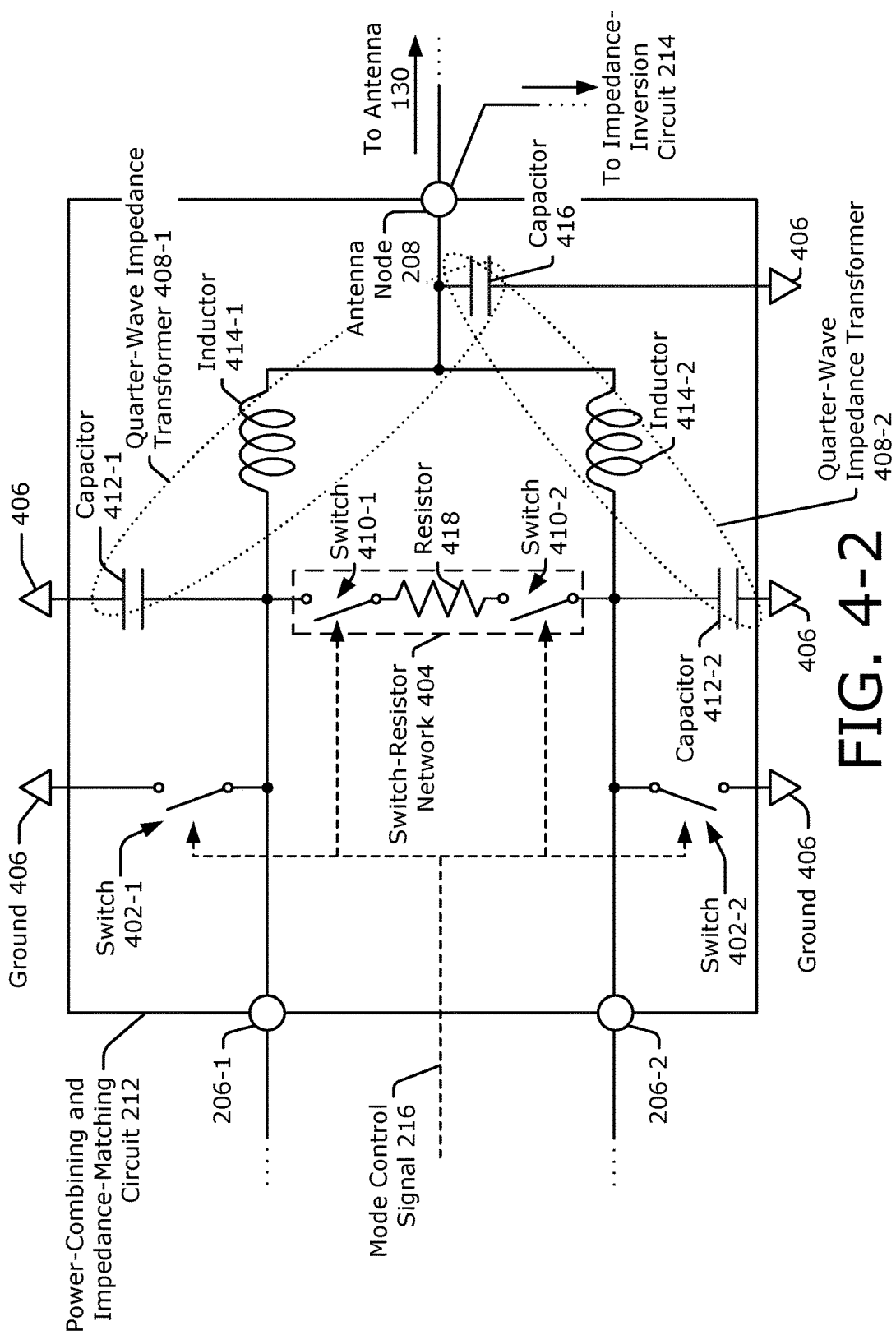

FIG. 4-1 illustrates an example power-combining and impedance-matching circuit 212 for time-division duplexing using dynamic transceiver isolation. In the depicted configuration, the power-combining and impedance-matching circuit 212 includes two switches 402-1 and 402-2, a switch-resistor network 404, and two quarter-wave (¼ λ) impedance transformers 408-1 and 408-2. The switches 402-1 and 402-2 are respectively coupled between the transmit nodes 206-1 and 206-2 and a ground 406.

The switch-resistor network 404 is coupled between the two transmit nodes 206-1 and 206-2, and includes at least one other switch coupled in series to at least one resistor (as shown in FIG. 4-2). A resistance of the switch-resistor network 404 is based on a characteristic impedance of the power-combining and impedance-matching circuit 212 between the two transmit nodes 206-1 and 206-2 and the antenna node 208. The resistance of the switch-resistor network 404 may be on the order a few tens of ohms (e.g., less than approximately 100 ohms). The switch-resistor network 404 enables the two transmit nodes 206-1 and 206-2 to be isolated with respect to one another during transmission, as described in further detail below.

The quarter-wave impedance transformers 408-1 and 408-2 are respectively coupled between the transmit nodes 206-1 and 206-2 and the antenna node 208. Different implementations of the quarter-wave impedance transformers 408-1 and 408-2 may use transmission lines or passive components, such as inductors and capacitors (as shown in FIG. 4-2). In general, the quarter-wave impedance transformers 408-1 and 408-2 are tuned to a frequency near a center of a transmission frequency band (e.g., such as approximately 40 GHz for millimeter-wave communications).

Characteristic impedances of the quarter-wave impedance transformers 408-1 and 408-2 can be set to achieve a target impedance translation ratio for matching impedances of the power-amplifying paths 202-1 and 202-2 to the antenna 130. In some implementations, the characteristic impedances of the quarter-wave impedance transformers 408-1 and 408-2 may differ. For example, if the power amplifier circuit 122 is unbalanced, the power-combining and impedance-matching circuit 212 may also be unbalanced to provide different impedance transformation ratios between the transmit nodes 206-1 and 206-2 and the antenna node 208. In this situation, an impedance looking from the transmit node 206-1 to the antenna node 208 differs from another impedance looking from the transmit node 206-2 to the antenna node 208. In other implementations, the power-combining and impedance-matching circuit 212 may be balanced and thereby have a similar impedance looking from the transmit node 206-1 to the antenna node 208 or from the transmit node 206-2 to the antenna node 208. In the balanced configuration, the power-combining and impedance-matching circuit 212 can be considered a modified-Wilkinson combiner, which includes the switches 402-1 and 402-2 and the switch-resistor network 404 coupled to input nodes (e.g., the transmit nodes 206-1 and 206-2) of the modified Wilkinson combiner.

The control circuitry 128 (not shown) is coupled to the switches 402-1 and 402-2 and the switch-resistor network 404. The control circuitry 128 controls respective states of the switches 402-1 and 402-2 and the switch-resistor network 404 via the mode control signal 216. The mode control signal 216 can, for example, cause the switches 402-1 and 402-2 and the switch-resistor network 404 to be in an open state or a closed state. Using the switches 402-1 and 402-2 and the switch-resistor network 404, the control circuitry 128 can individually adjust impedances between the transmit nodes 206-1 and 206-2 and the antenna node 208. In this way, the power-combining and impedance-matching circuit 212 can have a low impedance (e.g., provide a low-impedance path) from at least one of the transmit nodes 206-1 or 206-2 to the antenna node 208 or provide a high impedance (e.g., provide a high-impedance path) from the antenna node 208 to at least one of the transmit nodes 206-1 or 206-2.

The high impedance or the low impedance are realized based on a property of the quarter-wave impedance transformer 408-1 and 408-2. In particular, an input impedance looking into a terminal of the quarter-wave impedance transformer 408-1 or 408-2 is inversely proportional to a load impedance at another terminal of the quarter-wave impedance transformer 408-1 or 408-2. In other words, the input impedance is either high or low based on the load impedance being low or high, respectively. Generally, the high or low input impedances cause the quarter-wave impedance transformers 408-1 and 408-2 to act as open circuits or short circuits, respectively. The high impedance may be approximately one hundred times larger than the low impedance or more.

Typically the power-amplifying paths 202-1 and 202-2 have a lower output impedance relative to an input impedance of the antenna 130. Therefore if the switches 402-1 and 402-2 are in the open state, the quarter-wave impedance transformers 408-1 and 408-2 operate with low input impedances as seen from the transmit nodes 206-1 and 206-2 to the antenna node 208 due to the large load impedance of the antenna 130. However, if the switches 402-1 and 402-2 are in the closed state and ground the transmit nodes 206-1 and 206-2, the quarter-wave impedance transformers 408-1 and 408-2 operate with high input impedances as seen from the antenna node 208 to the transmit nodes 206-1 and 206-2 due to the small load impedance at the ground. In this case, the high impedances isolate the transmit nodes 206-1 and 206-2 from the antenna node 208. Because the switches 402-1 and 402-2 are independently controlled, the power-combining and impedance-matching circuit 212 can independently isolate the transmit nodes 206-1 and 206-2. As described above, the power-combining and impedance-matching circuit 212 isolates either one or both of the transmit nodes 206-1 and 206-2 from the antenna node 208 without disconnecting the transmit nodes 206-1 and 206-2 from the antenna node 208.

If both power-amplifying paths 202-1 and 202-2 are in the active state, such as for a high-power transmit mode, the power-combining and impedance-matching circuit 212 can also isolate the two transmit nodes 206-1 and 206-2 from each other to provide protection against the power-amplifying paths 202-1 and 202-2 interfering with one another. In this case, a portion of the uplink signal 220 that is amplified by the power-amplifying path 202-1 propagates from the transmit node 206-1 to the transmit node 206-2 through the antenna node 208. Because the amplified signal passes through the impedance transformers 408-1 and 408-2, a phase of the amplified signal at the transmit node 206-2 is shifted by approximately 180 degrees. By connecting the transmit nodes 206-1 and 206-2 together, the switch-resistor network 404 provides another path from the transmit node 206-1 to the transmit node 206-2, which does not pass through the quarter-wave impedance transformers 408-1 or 408-2. As a result, the amplified signal that passes through the switch-resistor network 404 from the transmit node 206-1 to the transmit node 206-2 has another phase that remains relatively unchanged and is therefore approximately 180 degrees out-of-phase with respect to the amplified signal that propagates through the antenna node 208. This relative phase difference causes the amplified signals to cancel each other at the transmit node 206-2, which effectively isolates the transmit nodes 206-1 and 206-2 from each other.

If one of the power-amplifying paths 202-1 or 202-2 is in the active state, the power-combining and impedance-matching circuit 212 can provide a low impedance path from the transmit node 206-1 or 206-2 that is coupled to an active power-amplifying path 202-1 or 202-2 to the antenna node 208, as described above. Additionally, the power-combining and impedance-matching circuit 212 can isolate the inactive power-amplifying path 202-1 or 202-2 from the active power-amplifying path 202-1 or 202-2 by providing a high impedance from the antenna node 208 to the other transmit node 206-1 or 206-2 that is coupled to the inactive power-amplifying path 202-1 or 202-2. For example, if the power-amplifying path 202-1 is in the active state, the switch 402-1 is in the open state to pass the amplified signal to the antenna node 208. The switch 402-2, however, is in the closed state to isolate the transmit node 206-2 from the transmit node 206-1. By isolating the transmit node 206-1 or 206-2 associated with the inactive power-amplifying path 202-1 or 202-2, the power-combining and impedance-matching circuit 212 facilitates passing of the uplink signal 220 from the active power-amplifying path 202-1 or 202-2 to the antenna 130 instead of to the inactive power-amplifying path 202-1 or 202-2.

Although not shown in FIG. 2, 3, or 4-1, another implementation of the power amplifier circuit 122 may include a single power-amplifying path 202. In this case, the power-combining and impedance-matching circuit 212 can include a single transmit node 206, a single switch 402, and a single quarter-wave impedance transformer 408. Although a single transmit-power mode may be supported using a single power-amplifying path 202, the time-division duplex interface circuit 126 can improve a signal-to-noise ratio performance by dynamically isolating the single power-amplifying path 202 or the low-noise amplifier 124 from the antenna 130. Example implementations of the quarter-wave impedance transformers 408-1 and 408-2 and the switch-resistor network 404 are shown in FIG. 4-2.

FIG. 4-2 illustrates example implementations of the quarter-wave impedance transformers 408-1 and 408-2 and the switch-resistor network 404 for time-division duplexing using dynamic transceiver isolation. In the depicted configuration, the switch-resistor network 404 includes a resistor 418 and switches 410-1 and 410-2. The resistor 418 is coupled in series between the switches 410-1 and 410-2. In other implementations, the switch-resistor network 404 may include a single switch 410 coupled in series between two resistors 418. Based on the mode control signal 216, the switches 410-1 and 410-2 can be in the closed state for a high-power transmit mode to isolate the transmit nodes 206-1 and 206-2 from each other. Alternatively for low-power transmit modes or a receive mode, the mode control signal 216 can cause the switches 410-1 and 410-2 to be in the open state.

The quarter-wave impedance transformer 408-1 includes a capacitor 412-1 coupled between the transmit node 206-1 and the ground 406, an inductor 414-1 coupled in series between the transmit node 206-1 and the antenna node 208, and a capacitor 416 coupled between the antenna node 208 and the ground 406. Similarly, the quarter-wave impedance transformer 408-2 includes a capacitor 412-2 coupled between the transmit node 206-2 and the ground 406, an inductor 414-2 coupled in series between the transmit node 206-2 and the antenna node 208, and the capacitor 416. Inductances of the inductors 414-1 and 414-2 and capacitances of the capacitors 412-1, 412-2, and 416 may be based on target impedance translation ratios and characteristic impedances of the quarter-wave impedance transformers 408-1 and 408-2. In some implementations, the capacitors 412-1 or 412-2 may be combined with other capacitors within the power-amplifying paths 202-1 or 202-2, respectively.

In some implementations, the inductors 414-1 and 414-2 are magnetically coupled together as a transformer to save area. A higher order inductor-capacitor based quarter-wave impedance transformer 408 can also be implemented if the power amplifier circuit 122 includes additional power-amplifying paths 202 (not shown), which are controlled separately. In this way, the time-division duplex interface circuit 126 can combine power from more than two power amplifying paths 202.

Figure 5:
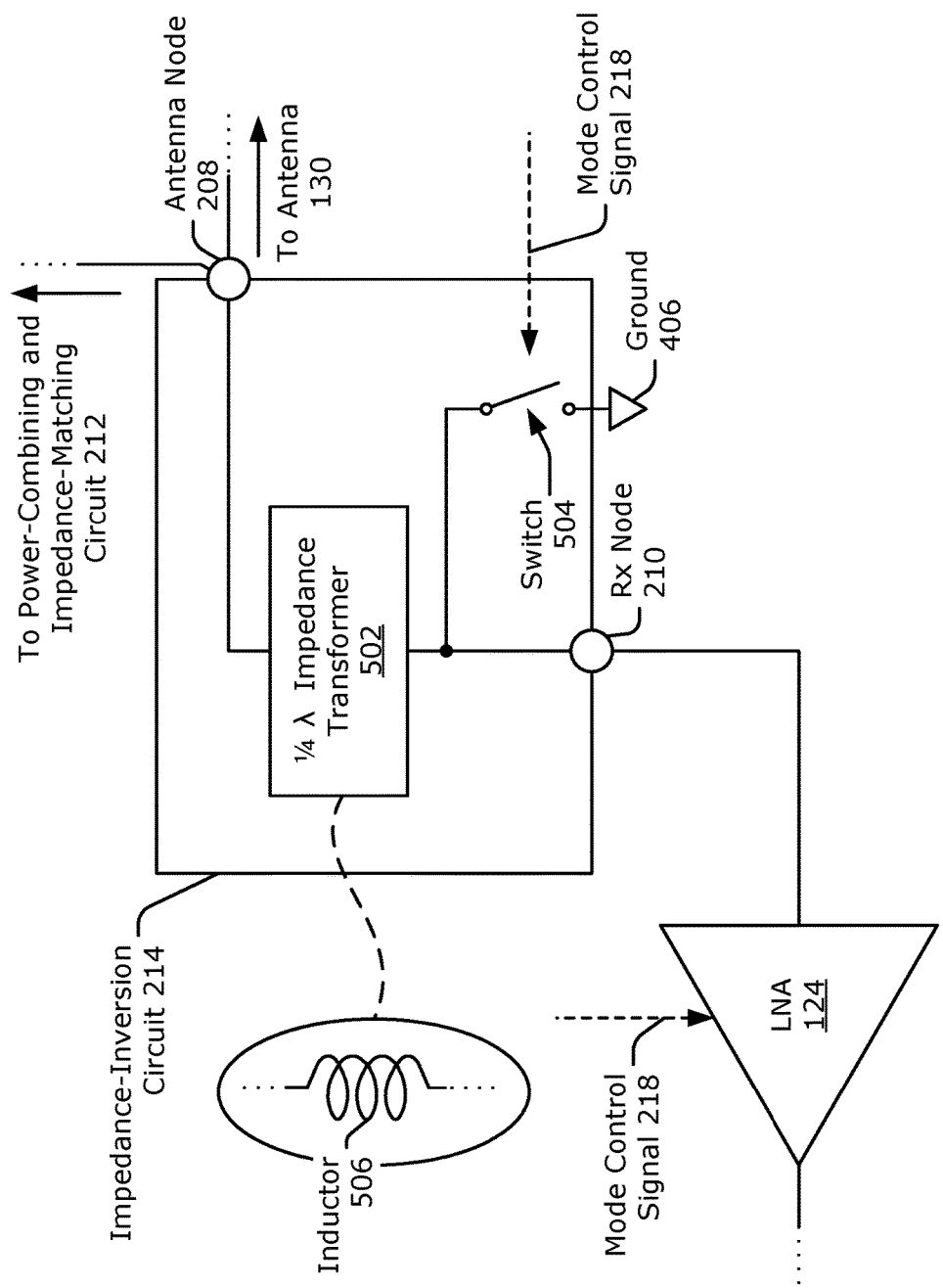
FIG. 5 illustrates an example impedance-inversion circuit for time-division duplexing using dynamic transceiver isolation.

FIG. 5 illustrates an example impedance-inversion circuit 214 for time-division duplexing using dynamic transceiver isolation. In the depicted configuration, the impedance-inversion circuit 214 includes at least one quarter-wave impedance transformer 502 and at least one switch 504. The quarter-wave impedance transformer 502 is coupled in series between the antenna node 208 and the receive node 210 and may be implemented using a transmission line or an inductor, such as the inductor 506. Although not explicitly shown, the wireless transceiver or front-end module 120 may include impedance-matching circuitry (e.g., similar to the impedance-matching circuitry 304-1 or 304-2) to provide a target impedance translation ratio for matching an input impedance of the low-noise amplifier 124 to an impedance of the antenna 130. In some implementations, the impedance-matching circuitry may be implemented in full or in part by the quarter-wave impedance transformer 502. By using the quarter-wave impedance transformer 502 to provide at least a portion of a target impedance translation ratio between the antenna 130 and the low-noise amplifier 124, an overall receiver noise figure and area of the wireless transceiver or front-end module 120 can be reduced.

The switch 504 is coupled between the receive node 210 and the ground 406. The switch 504 may have a thin gate oxide or be implemented with a single transistor to reduce parasitics and enable a small input load impedance to be experienced by the low-noise amplifier 124. In some implementations, two or more of the switches 402-1 and 402-2 (of FIG. 4-1), the switches 410-1 and 410-2, or the switch 504 may be connected in series to increase reliability.

Similar to the power-combining and impedance-matching circuit 212, the impedance-inversion circuit 214 can have a low impedance (e.g., provide a low-impedance path) from the antenna node 208 to the receive node 210 or have a high impedance (e.g., provide a high-impedance path) from the antenna node 208 to the receive node 210 based on whether the switch 504 is in the open state or the closed state, respectively. Based on the low impedance, the impedance-inversion circuit 214 passes the downlink signal 222 from the antenna node 208 to the receive node 210. Based on the high impedance, the impedance-inversion circuit 214 isolates the receive node 210 from the antenna node 208 without disconnecting the receive node 210 from the antenna node 208. The mode control signal 216 may also disable the low-noise amplifier 124 if the switch 504 is closed to conserve power and reduce noise.

As shown in FIGS. 4-1, 4-2, and 5, the time-division duplex interface circuit 126 may be implemented without using magnetically-coupled inductors (e.g., transformers) to couple the power amplifier circuit 122 or the low-noise amplifier 124 to the antenna 130. In this way, a layout of the time-division duplex interface circuit 126 is flexible and can support a variety of different wireless transceiver or front-end module 120 architectures. These different architectures may position the power amplifier circuit 122 or the low-noise amplifier 124 at various distances from the antenna 130 or from each other. The time-division duplex interface circuit 126 may also be implemented using complementary metal-oxide-semiconductor (CMOS) technology. Example operational modes are further described with respect to FIG. 6.

Figure 6:
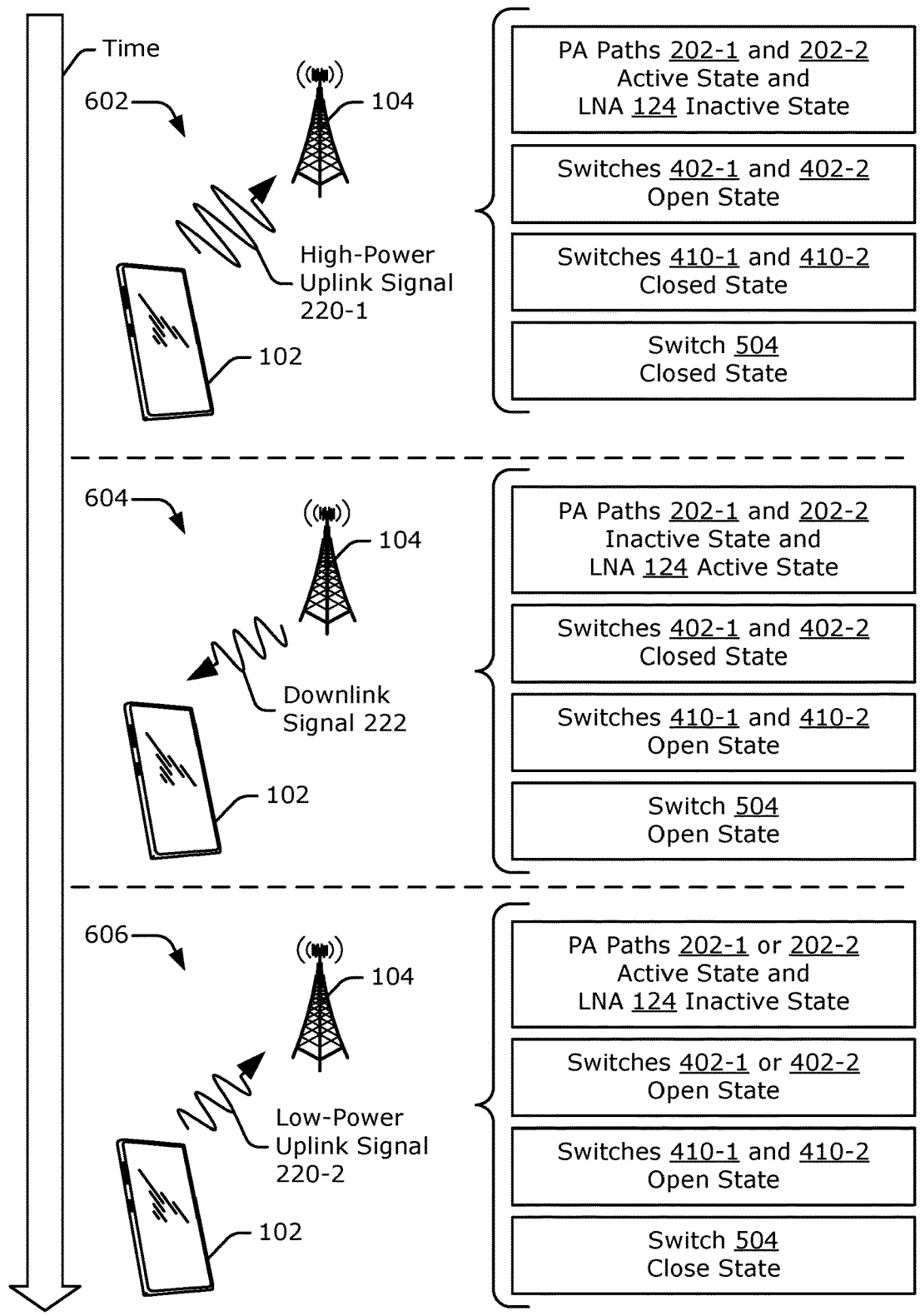
FIG. 6 illustrates an example scheme for time-division duplexing using dynamic transceiver isolation.

FIG. 6 illustrates an example scheme for time-division duplexing using dynamic transceiver isolation, with time elapsing in a downward direction. At 602, the wireless transceiver or front-end module 120 operates in a high-power transmit mode to transmit a high-power uplink signal 220-1 to the base station 104. To provide the target amplification, the control circuitry 128 activates both of the power-amplifying paths 202-1 and 202-2 via the mode control signal 216. The mode control signal 216 may also disable the low-noise amplifier 124 to conserve power and reduce noise. Within the power-combining and impedance-matching circuit 212, the switches 402-1 and 402-2 (of FIG. 4-1 or 4-2) are in the open state so that a low-impedance path occurs from the transmit nodes 206-1 and 206-2 to the antenna node 208. The switches 410-1 and 410-2 (of FIG. 4-2) are in the closed state to isolate the transmit nodes 206-1 and 206-2 from each other. At the antenna node 208, the power-combining and impedance-matching circuit 212 combines amplified signals respectively generated via the power-amplifying paths 202-1 and 202-2 to produce the high-power uplink signal 220-1. Within the impedance-inversion circuit 214, the switch 504 is in the closed state to provide a high-impedance path from the antenna node 208 to the receive node 210. This facilitates propagation of the high-power uplink signal 220-1 to the antenna node 208 and improves a signal-to-noise ratio of the high-power uplink signal 220-1 because the low-noise amplifier 124 is isolated from the antenna 130.

At 604, the wireless transceiver or front-end module 120 operates in a receive mode to process a downlink signal 222 that is received by the antenna 130 from the base station 104. Using the mode control signal 216, the control circuitry 128 causes the power-amplifying paths 202-1 and 202-2 to be in the inactive state and the low-noise amplifier 124 to be in the active state. To pass the downlink signal 222 to the low-noise amplifier 124, the control circuitry 128 causes the switch 504 to be in the open state so that a low-impedance path occurs from the receive node 210 to the antenna node 208. Within the power-combining and impedance-matching circuit 212, the switches 402-1 and 402-2 are in the closed state and the switches 410- and 410-2 are in the open state to isolate the transmit nodes 206-1 and 206-2 from the antenna node 208. This facilitates propagation of the downlink signal 222 to the receive node 210 and improves a signal-to-noise ratio of the low-power uplink signal 220-2 because the power amplifier circuit 122 is isolated from the antenna 130.

At 606, the wireless transceiver or front-end module 120 operates in a low-power transmit mode to transmit a low-power uplink signal 220-2 to the base station 104. To provide the target amplification and conserve power, the control circuitry 128 causes one of the power-amplifying paths 202-1 or 202-2 to be in the active state and another power-amplifying path 202-1 or 202-2 to be in the inactive state via the mode control signal 216. The mode control signal 216 may also cause the low-noise amplifier 124 to be in the inactive state to conserve power and reduce noise. Within the power-combining and impedance-matching circuit 212, one of the switches 402-1 or 402-2 that is coupled to the inactive power-amplifying path 202-1 or 202-2 is in the closed state to isolate the associated transmit node 206-1 or 206-2 from the antenna node 208. In addition, another of the switches 402-1 or 402-2 that is coupled to the active power-amplifying path 202-1 or 202-2 is in the open state to pass the low-power uplink signal 220-2 to the antenna 130. The switches 410-1 and 410-2 are in the open state to isolate the inactive power-amplifying path 202-1 or 202-2 from the antenna 130. Similar to 602, the switch 504 within the impedance-inversion circuit 214 is in the closed state to isolate the low-noise amplifier 124 from the antenna 130.

Figure 7:
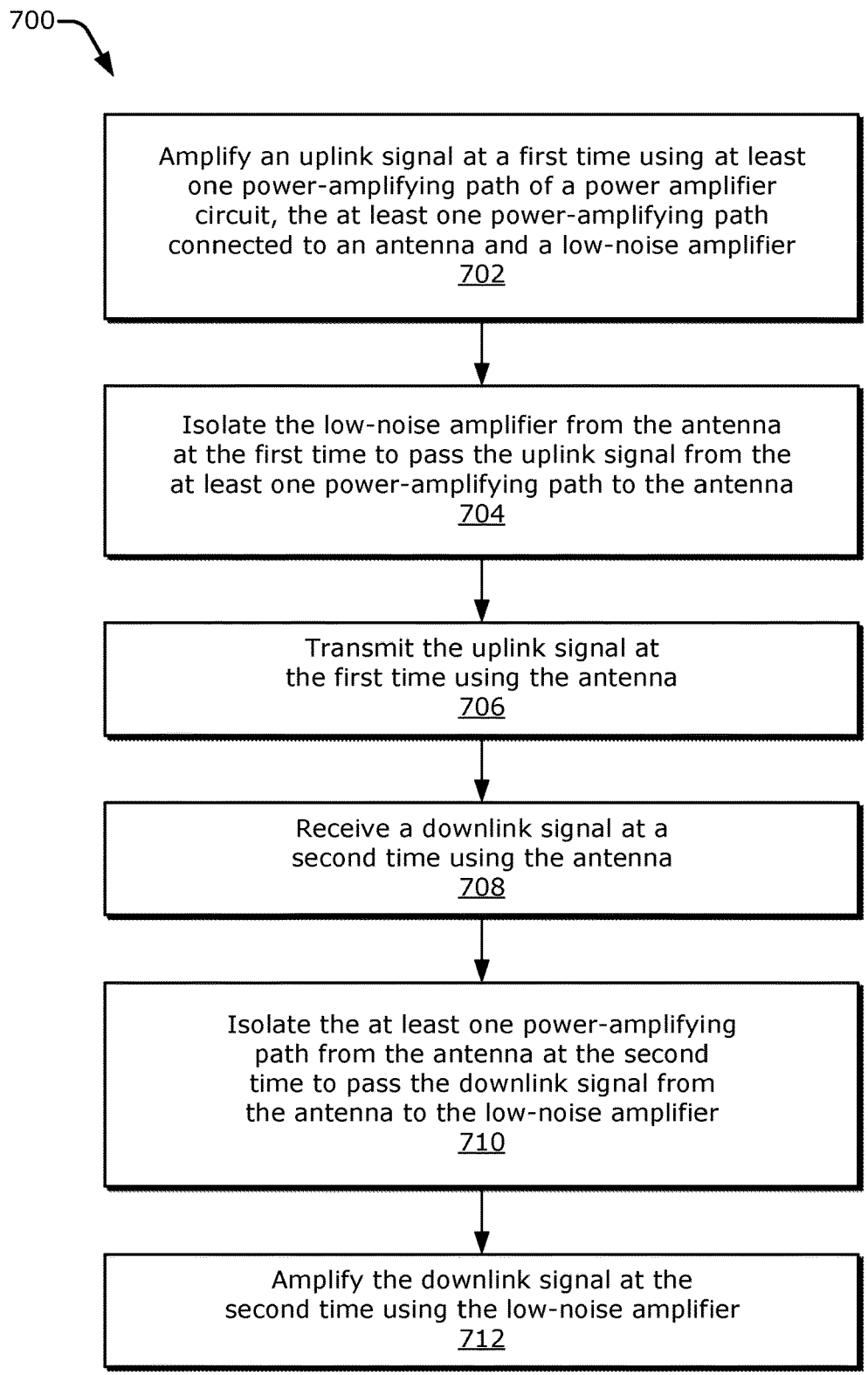
FIG. 7 is a flow diagram illustrating an example process for time-division duplexing using dynamic transceiver isolation.

FIG. 7 is a flow diagram illustrating an example process 700 for time-division duplexing using dynamic transceiver isolation. The process 700 is described in the form of a set of blocks 702-712 that specify operations that can be performed. However, operations are not necessarily limited to the order shown in FIG. 7 or described herein, for the operations may be implemented in alternative orders or in fully or partially overlapping manners. Operations represented by the illustrated blocks of the process 700 may be performed by a wireless transceiver or front-end module 120 (e.g., of FIG. 1 or 2) or a time-division duplex interface circuit 126 (e.g., of FIG. 1 or 2). More specifically, the operations of the process 700 may be performed by a power-combining and impedance-matching circuit 212 or an impedance-inversion circuit 214.

At block 702, an uplink signal is amplified at a first time using at least one power-amplifying path of a power amplifier circuit. The at least one power-amplifying path is connected to an antenna and a low-noise amplifier. For example, the power-amplifying path 202-1 or 202-2 amplifies the uplink signal 220 at a first time, as shown in FIG. 2. The time-division duplex interface circuit 126 connects the power-amplifying paths 202-1 and 202-2 to the antenna 130 and the low-noise amplifier 124. The power-amplifying paths 202-1 or 202-2 can be in an active state based on the mode control signal 216, which is generated by the control circuitry 128. The control circuitry 128 can control which one or more power-amplifying paths 202-1 or 202-2 are activated based on a target transmission power level or an operational mode (e.g., the high-power transmit mode or the low-power transmit mode as described in FIG. 6).

At block 704, the low-noise amplifier is isolated from the antenna at the first time to pass the uplink signal from the at least one power-amplifying path to the antenna. For example, the impedance-inversion circuit 214 isolates the low-noise amplifier 124 from the antenna 130 at the first time to pass the uplink signal 220 from the power-amplifying path 202-1 or 202-2 to the antenna 130, as shown in FIG. 2. The switch 504 and the quarter-wave impedance transformer 502 shown in FIG. 5 can provide a high impedance from the antenna node 208 to the receive node 210 if the switch 504 is in the closed state and connects the receive node 210 to the ground 406.

At block 706, the uplink signal is transmitted at the first time using the antenna. For example, the antenna 130 transmits the uplink signal 220 at the first time. The uplink signal 220 may be a high-power uplink signal 220-1 or a low-power uplink signal 220-2, depending on which power-amplifying paths 202-1 and 202-2 are activated. In FIG. 6, the high-power uplink signal 220-1 and the low-power uplink signal 220-2 are transmitted at times associated with 602 and 606, respectively.

At block 708, a downlink signal is received at a second time using the antenna. For example, the antenna 130 receives the downlink signal 222 at the second time, as shown in FIG. 2. In FIG. 6, the downlink signal 222 is received at a time associated with 604.

At 710, the at least one power-amplifying path is isolated from the antenna at the second time to pass the downlink signal from the antenna to the low-noise amplifier. For example, the power-combining and impedance-matching circuit 212 isolates the power-amplifying paths 202-1 and 202-2 from the antenna 130 at the second time to pass the downlink signal 222 from the antenna 130 to the low-noise amplifier 124, as shown in FIG. 2. The switches 402-1 and 402-2 and the quarter-wave impedance transformers 408-1 and 408-2 (of FIG. 4-1) can provide high impedances from the antenna node 208 to the transmit nodes 206-1 and 206-2 if the switches 402-1 and 402-2 are in the closed state and respectively connect the transmit nodes 206-1 and 206-2 to the ground 406. If the power-combining and impedance-matching circuit 212 includes the switch-resistor network 404, the switches 410-1 and 410-2 within the switch-resistor network 404 are in the open state to enable the transmit nodes 206-1 and 206-2 to be isolated from the antenna node 208.

At 712, the downlink signal is amplified at the second time using the low-noise amplifier. For example, the low-noise amplifier 124 amplifies the downlink signal 222, as shown in FIG. 2.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
   an antenna;
   a power amplifier circuit including at least one power-amplifying path;
   a low-noise amplifier; and
   a time-division duplex interface circuit including:
      at least one transmit node coupled to the at least one power-amplifying path;
      a receive node coupled to the low-noise amplifier; and
      an antenna node coupled to the at least one transmit node, the receive node, and the antenna at both a first time and a second time,
      the time-division duplex interface circuit configured to:
         isolate the receive node from the antenna node at the first time based on a mode control signal; and
         isolate the at least one transmit node from the antenna node at the second time based on the mode control signal.

2. The apparatus of claim 1, wherein:
   the power amplifier circuit is configured to amplify an uplink signal at the first time using the at least one power-amplifying path;
   the low-noise amplifier is configured to amplify a downlink signal at the second time; and
   the time-division duplex interface circuit is configured to operate with:
      a low impedance from the at least one transmit node to the antenna node and a high impedance from the antenna node to the receive node at the first time to isolate the low-noise amplifier and pass the uplink signal from the at least one power-amplifying path to the antenna; and
      another low impedance from the antenna node to the receive node and another high impedance from the antenna node to the at least one transmit node at the second time to isolate the at least one power-amplifying path and pass the downlink signal from the antenna to the low-noise amplifier.

3. The apparatus of claim 1, wherein the time-division duplex interface circuit includes:
   at least one quarter-wave impedance transformer coupled between the at least one transmit node and the antenna node;
   at least one switch coupled between the at least one transmit node and a ground, the at least one switch configured to selectively be in:
      an open state at the first time to disconnect the at least one transmit node from the ground; or
      a closed state at the second time to connect the at least one transmit node to the ground;
   another quarter-wave impedance transformer coupled between the receive node and the antenna node; and
   another switch coupled between the receive node and the ground, the other switch configured to selectively be in:
      a closed state at the first time to connect the receive node to the ground; or
      an open state at the second time to disconnect the receive node from the ground.

4. The apparatus of claim 3, wherein the at least one quarter-wave impedance transformer includes:
   a capacitor coupled between the at least one transmit node and the ground;
   an inductor coupled between the at least one transmit node and the antenna node; and
   another capacitor coupled between the antenna node and the ground.

5. The apparatus of claim 3, wherein the other quarter-wave impedance transformer includes an inductor coupled between the receive node and the antenna node.

6. The apparatus of claim 3, wherein:
   the at least one quarter-wave impedance transformer and the at least one switch are together configured to selectively provide:
      a low impedance from the at least one transmit node to the antenna node at the first time responsive to the at least one switch being in the open state; or
      a high impedance from the antenna node to the at least one transmit node at the second time responsive to the at least one switch being in the closed state to isolate the at least one transmit node from the antenna node; and
   the other quarter-wave impedance transformer and the other switch are together configured to selectively provide:
      another high impedance from the antenna node to the receive node at the first time responsive to the other switch being in the closed state to isolate the receive node from the antenna node; or
      another low impedance from the antenna node to the receive node at the second time responsive to the other switch being in the open state.

7. The apparatus of claim 3, wherein:
   the at least one power-amplifying path includes a first power-amplifying path and a second power-amplifying path;
   the at least one transmit node includes a first transmit node and a second transmit node, the first transmit node coupled to the first power-amplifying path, the second transmit node coupled to the second power-amplifying path;
   the at least one switch includes a first switch and a second switch, the first switch coupled between the first transmit node and the ground, the second switch coupled between the second transmit node and the ground; and
   the at least one quarter-wave impedance transformer includes a first quarter-wave impedance transformer and a second quarter-wave impedance transformer, the first quarter-wave impedance transformer coupled between the first transmit node and the antenna node, the second quarter-wave impedance transformer coupled between the second transmit node and the antenna node.

8. The apparatus of claim 7, wherein:
   the first power-amplifying path is configured to selectively be in:
      an active state to amplify at least a portion of a radio-frequency signal at the first time; or
      an inactive state at the first time; and
   the second power-amplifying path is configured to selectively be in:
      the active state to amplify at least another portion of the radio-frequency signal at the first time; or
      the inactive state at the first time.

9. The apparatus of claim 8, wherein:
   the first switch is configured to selectively be in:
      the closed state at the first time based on the first power-amplifying path being in the inactive state; or
      the open state at the first time based on the first power-amplifying path being in the active state; and
   the second switch is configured to selectively be in:
      the closed state at the first time based on the second power-amplifying path being in the inactive state; or the open state at the first time based on the second power-amplifying path being in the active state.

10. The apparatus of claim 9, wherein:
the first quarter-wave impedance transformer and the first switch are together configured to selectively provide:
  a low impedance from the first transmit node to the antenna node at the first time responsive to the first switch being in the open state to pass the portion of the radio-frequency signal from the first transmit node to the antenna node; or
  a high impedance from the antenna node to the first transmit node at the first time responsive to the first switch being in the closed state to isolate the first transmit node from the antenna node; and
the second quarter-wave impedance transformer and the second switch are together configured to selectively provide:
  another low impedance from the second transmit node to the antenna node at the first time responsive to the second switch being in the open state to pass the other portion of the radio-frequency signal to the antenna node; or
  another high impedance from the antenna node to the second transmit node at the first time responsive to the second switch being in the closed state to isolate the second transmit node from the antenna node at the first time.

11. The apparatus of claim 8, wherein the time-division duplex interface circuit includes a switch-resistor network coupled between the first transmit node and the second transmit node, the switch-resistor network including at least one resistor and at least one other switch coupled together in series between the first transmit node and the second transmit node, the at least one other switch configured to selectively be in:
  the closed state at the first time based on both the first power-amplifying path and the second power-amplifying path being in the active state; or
  the open state at the first time.

12. The apparatus of claim 11, wherein:
the at least one other switch is configured to be in the open state at the second time;
the first power-amplifying path is configured to be in the inactive state at the second time; and
the second power-amplifying path is configured to be in the inactive state at the second time.

13. An apparatus comprising:
an antenna;
a power amplifier circuit including at least one power-amplifying path;
a low-noise amplifier; and
interface means for isolating the low-noise amplifier from the antenna at a first time based on a mode control signal and isolating the at least one power-amplifying path from the antenna at a second time based on the mode control signal while coupling the at least one power-amplifying path, the low-noise amplifier, and the antenna together at both the first time and the second time.

14. The apparatus of claim 13, wherein the interface means includes:
inversion means for providing a low impedance from the at least one power-amplifying path to the antenna at the first time and a high impedance from the antenna to the at least one power-amplifying path at the second time; and
other inversion means for providing another high impedance from the antenna to the low-noise amplifier at the first time and another low impedance from the antenna to the low-noise amplifier at the second time.

15. The apparatus of claim 14, wherein:
the inversion means includes:
  transformation means for causing an impedance as seen from the antenna to the at least one power-amplifying path to be inversely proportional to a load impedance at the at least one power-amplifying path, the transformation means coupled between the at least one power-amplifying path and the antenna; and
  switching means for selectively connecting or disconnecting a ground to or from at least one transmit node, the at least one transmit node coupled between the at least one power-amplifying path and the antenna; and
the other inversion means includes:
  other transformation means for causing another impedance as seen from the antenna to the low-noise amplifier to be inversely proportional to another load impedance at the low-noise amplifier, the other transformation means coupled between the low-noise amplifier and the antenna; and
  other switching means for selectively connecting or disconnecting the ground to or from a receive node, the receive node coupled between the low-noise amplifier and the antenna.

16. The apparatus of claim 15, wherein:
the transformation means includes impedance means for matching respective impedances of the at least one power-amplifying path and the antenna at the first time; and
the other transformation means includes other impedance means for matching respective impedances of the low-noise amplifier and the antenna at the second time.

17. The apparatus of claim 15, wherein:
the at least one power-amplifying path includes two power-amplifying paths;
the transformation means is configured to cause respective impedances as seen from the antenna to the two power-amplifying paths to be inversely proportional to respective load impedances at the two power-amplifying paths, the transformation means coupled between two power-amplifying paths and the antenna; and
the switching means is configured to independently connect or disconnect the ground to or from two transmit nodes of the at least one transmit node, the two transmit nodes respectively coupled between the two power-amplifying paths and the antenna.

18. A method for time-division duplexing using dynamic transceiver isolation, the method comprising:
amplifying an uplink signal at a first time using at least one power-amplifying path of a power amplifier circuit, the at least one power-amplifying path coupled to an antenna and a low-noise amplifier;
isolating the low-noise amplifier from the antenna at the first time based on a mode control signal to pass the uplink signal from the at least one power-amplifying path to the antenna;
transmitting the uplink signal at the first time using the antenna;
receiving a downlink signal at a second time using the antenna;
isolating the at least one power-amplifying path from the antenna at the second time based on the mode control signal to pass the downlink signal from the antenna to the low-noise amplifier; and amplifying the downlink signal at the second time using the low-noise amplifier.

19. The method of claim 18, wherein:

the isolating of the low-noise amplifier comprises providing a high impedance from the antenna to the low-noise amplifier at the first time; and the isolating of the at least one power-amplifying path comprises providing another high impedance from the antenna to the at least one power-amplifying path at the second time.

20. The method of claim 18, further comprising:

amplifying the uplink signal at the first time using two power-amplifying paths of the at least one power-amplifying path to produce a high-power uplink signal;

isolating the two power-amplifying paths from each other at the first time to pass the high-power uplink signal from the two power-amplifying paths to the antenna; and transmitting the high-power uplink signal at the first time using the antenna.

21. The method of claim 20, further comprising:

amplifying another uplink signal at a third time using a power-amplifying path of the two power-amplifying paths to produce a low-power uplink signal;

isolating another power-amplifying path of the two power-amplifying paths from the antenna at the third time to pass the low-power uplink signal from the power-amplifying path to the antenna; and transmitting the low-power uplink signal at the third time using the antenna.

22. An apparatus comprising:

an antenna;

a power amplifier circuit including two power-amplifying paths; and a time-division duplex interface circuit including two transmit nodes and an antenna node, the two transmit nodes respectively coupled to the two power-amplifying paths, the antenna node coupled to the two transmit nodes and the antenna at both a first time and a second time, the time-division duplex interface circuit configured to:

isolate a transmit node of the two transmit nodes from the antenna node at the first time based on a mode control signal; and isolate the two transmit nodes from each other at the second time based on the mode control signal.

23. The apparatus of claim 22, wherein:

a power-amplifying path of the two power-amplifying paths is coupled to the transmit node, the power-amplifying path configured to be in:

an inactive state at the first time; and an active state at the second time to amplify at least a portion of a radio-frequency signal; and another power-amplifying path of the two power-amplifying paths is configured to be in the active state at the first time and the second time to amplify at least another portion of the radio-frequency signal.

24. The apparatus of claim 22, wherein the time-division duplex interface circuit includes:

two switches respectively coupled between the two transmit nodes and a ground;

two quarter-wave impedance transformers respectively coupled between the two transmit nodes and the antenna node; and a switch-resistor network coupled between the two transmit nodes, the switch-resistor network including at least one resistor and at least one other switch coupled together in series between the two transmit nodes.

25. The apparatus of claim 24, wherein:

the two transmit nodes include another transmit node;

the two switches include:

a switch coupled between the transmit node and the ground, the switch configured to be in:

a closed state at the first time; and an open state at the second time; and another switch coupled between the other transmit node and the ground, the other switch configured to be in the open state at both the first time and the second time;

the two quarter-wave impedance transformers include a quarter-wave impedance transformer coupled between the transmit node and the antenna node, the quarter-wave impedance transformer and the switch together configured to:

provide a high impedance from the antenna node to the transmit node at the first time responsive to the switch being in the closed state to isolate the transmit node from the antenna node; and provide a low impedance from the transmit node to the antenna node at the second time responsive to the switch being in the open state; and the at least one switch is configured to be in:

the open state at the first time; and the closed state at the second time to isolate the two transmit nodes from each other.

26. The apparatus of claim 25, wherein the two quarter-wave impedance transformers include another quarter-wave impedance transformer coupled between the other transmit node and the antenna node, the other quarter-wave impedance transformer and the other switch together configured to provide another low impedance from the other transmit node to the antenna node at both the first time and the second time.

27. The apparatus of claim 22, further comprising a low-noise amplifier, wherein the time-division duplex interface circuit includes a receive node coupled to the low-noise amplifier and the antenna node, the time-division duplex interface circuit configured to:

isolate the receive node from the antenna node at both the first time and the second time.

28. The apparatus of claim 27, wherein:

the low-noise amplifier is configured to amplify a radio-frequency signal at a third time; and the time-division duplex interface circuit is configured to:

isolate the two transmit nodes from the antenna node at the third time.

29. The apparatus of claim 22, wherein:

the power amplifier circuit comprises an unbalanced power-amplifier circuit, the two power-amplifying paths of the unbalanced power-amplifier circuit configured to provide different amounts of amplification; and the time-division duplex interface circuit comprises an unbalanced time-division duplex interface circuit, the unbalanced time-division duplex interface circuit configured to operate with different impedance translation ratios from each of the two transmit nodes to the antenna node.

30. The apparatus of claim 22, wherein:

the power amplifier circuit comprises a balanced power-amplifier circuit, the two power-amplifying paths of the balanced power-amplifier circuit configured to provide similar amounts of amplification; and the time-division duplex interface circuit comprises a balanced time-division duplex interface circuit, the balanced time-division duplex interface circuit configured to operate with similar impedance translation ratios from each of the two transmit nodes to the antenna node.

* * * * *